US006728159B2

(12) United States Patent
Anand et al.

(10) Patent No.: US 6,728,159 B2
(45) Date of Patent: Apr. 27, 2004

(54) FLEXIBLE MULTIBANKING INTERFACE FOR EMBEDDED MEMORY APPLICATIONS

(75) Inventors: Darren L. Anand, Essex Junction, VT (US); John E. Barth, Jr., Willston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/026,118

(22) Filed: Dec. 21, 2001

(65) Prior Publication Data
US 2003/0123278 A1 Jul. 3, 2003

(51) Int. Cl.[7] .............. G11C 8/00; G11C 7/00; G11C 29/00; G11C 7/02
(52) U.S. Cl. .............. 365/230.03; 365/189.03; 365/189.04; 365/189.05; 365/200; 365/207; 365/233
(58) Field of Search .............. 365/230.03, 189.03, 365/189.04, 189.05, 200, 207, 233, 230.06, 230.08, 193, 205, 185.09

(56) References Cited

U.S. PATENT DOCUMENTS

| | | | | |
|---|---|---|---|---|
| 5,430,742 A | * | 7/1995 | Jeddeloh et al. | 714/764 |
| 5,530,836 A | * | 6/1996 | Busch et al. | 711/150 |
| 5,596,740 A | * | 1/1997 | Quattromani et al. | 711/157 |
| 5,615,355 A | * | 3/1997 | Wagner | 711/167 |
| 5,650,977 A | * | 7/1997 | Kyung et al. | 365/230.03 |
| 5,732,017 A | * | 3/1998 | Schumann et al. | 365/185.11 |
| 5,787,457 A | | 7/1998 | Miller et al. | |
| 5,835,932 A | | 11/1998 | Rao | |
| 5,926,428 A | * | 7/1999 | Rao | 365/207 |
| 5,937,204 A | * | 8/1999 | Schinnerer | 345/531 |
| 5,956,288 A | * | 9/1999 | Bermingham et al. | 365/230.06 |
| 5,959,911 A | * | 9/1999 | Krause et al. | 365/201 |
| 5,959,930 A | | 9/1999 | Sakurai | |
| 5,998,251 A | | 12/1999 | Wu et al. | |
| 6,028,812 A | * | 2/2000 | Tanaka | 365/230.03 |
| 6,058,451 A | * | 5/2000 | Bermingham et al. | 711/106 |

(List continued on next page.)

OTHER PUBLICATIONS

ISSCC Submission #531, Paper 9.3 Oct. 30, 2001, A 300 MHz Multi–Banked, eDRAM macro featuring GND Sense, Bit–Line Twisting and Direct Reference Cell Write, J. Barth, D. Anand, J. Dreibelbis, E. Nelson, IBM MicroElectronics, Burlington, VT.

Embedded DRAM Design and Architecture for the IBM CU11 ASIC offering, John Barth et al., IBM Microelectronics Division, Essex Junction, VT, Jul. 30, 2001.

Primary Examiner—David Nelms
Assistant Examiner—Ly Duy Pham
(74) Attorney, Agent, or Firm—Steven Capella

(57) ABSTRACT

A growable multibank DRAM macro is achieved with a flexible multibank interface which can be grown without redesign and without change of appearance/behavior to the customer. The interface is preferably characterized by the presence of bank select inputs (pins) which permit selection of one or more banks of the macro. The banks preferably each have respective row decode circuitry and respective limited repair redundancy.

16 Claims, 2 Drawing Sheets

U.S. PATENT DOCUMENTS

| | | | |
|---|---|---|---|
| 6,061,297 A | * 5/2000 | Suzuki | 365/238.5 |
| 6,064,588 A | 5/2000 | Crafts | |
| 6,067,270 A | 5/2000 | Hwang | |
| 6,067,632 A | * 5/2000 | Yamaguchi | 713/600 |
| 6,081,468 A | 6/2000 | Taira et al. | |
| 6,122,217 A | 9/2000 | Keeth et al. | |
| 6,128,704 A | * 10/2000 | Jun | 711/140 |
| 6,133,083 A | 10/2000 | Lin et al. | |
| 6,166,942 A | 12/2000 | Vo et al. | |
| 6,173,356 B1 | * 1/2001 | Rao | 711/5 |
| 6,178,135 B1 | 1/2001 | Kang | |
| 6,212,607 B1 | * 4/2001 | Miller et al. | 711/149 |
| 6,310,815 B1 | * 10/2001 | Yamagata et al. | 365/230.03 |
| 6,381,671 B1 | * 4/2002 | Ayukawa et al. | 711/104 |
| 6,418,067 B1 | * 7/2002 | Watanabe et al. | 365/200 |
| 6,438,063 B1 | * 8/2002 | Lee | 365/230.03 |
| 2001/0052047 A1 | * 12/2001 | Ono | 711/5 |
| 2002/0015328 A1 | * 2/2002 | Dono et al. | 365/185.08 |
| 2002/0065981 A1 | * 5/2002 | Jenne et al. | 711/105 |

\* cited by examiner

FLEXIBLE MULTIBANKING INTERFACE FOR EMBEDDED MEMORY APPLICATIONS

BACKGROUND OF THE INVENTION

The present invention relates generally to an interface for embedded DRAM.

In most applications, the DRAM memory is intended to support the operation of one or more logic devices (e.g., microprocessors). In conventional DRAM applications, a dedicated chip(s) containing the DRAM memory was typically employed separate from the chip containing the microprocessor(s) or other logic devices. The data/control transmission between the DRAM and the logic device would typically be managed through a bus architecture on the circuit board containing the various chips. In such conventional configurations, the selection of DRAM architecture and interface was largely predetermined by the DRAM manufacturer and/or industry standards for the particular type of DRAM memory.

Where logic device manufacturers (e.g., ASICs manufacturers) had desired memory on the logic chip, this was generally accomplished using static random access memory (SRAM). Unfortunately, SRAM consumes a significant amount of chip area relative to the memory capacity provided (i.e., a single SRAM data cell usually requires on the order of six transistors). Thus, more recently, logic device manufacturers have moved toward the use of eDRAM for on-chip memory in order to conserve chip area and/or increase performance through more on-chip memory capacity. The motivation to replace SRAM implementations with eDRAM places additional pressure on macro performance and random cycle time.

The desire to embed DRAM into logic chips has resulted in the need for development of DRAM macro designs which are amenable to logic design environments. The logic or ASIC environment presents many difficult challenges that DRAMs have historically been sensitive to, such as wide voltage and temperature ranges and uncertainties in surrounding noise conditions. There is a need for DRAM macro designs having performance characteristics which can be varied by the logic designer without significant restructuring of the DRAM macro. There is also a desire for DRAM macro designs having improved bus utilization and speed.

SUMMARY OF THE INVENTION

The invention provides a synchronous multibank interface on a growable embedded DRAM. The flexible multibank interface of the invention can be grown without redesign and without change of appearance/behavior to the customer. The interface is preferably characterized by the presence of bank select inputs (pins) which permit selection of one or more banks of the macro. The banks preferably each have respective support circuitry including row decode circuitry and respective limited repair redundancy. The interface of the invention has advantages over typical synchronous DRAM interfaces in that operations to each bank are independent. Also, activation and pre-charge operations can both be completely hidden during reads and writes. The interface of the invention may be used to support multiple bank configurations with any number of banks (i.e., one or more banks).

In one aspect, the invention encompasses a multibank DRAM macro comprising:

(a) a plurality of DRAM memory banks, each bank respectively comprising:
   (i) an array of DRAM memory cells,
   (ii) bitlines and wordlines, respectively defining columns and rows of the array, and
   (iii) a row address decoder circuit,
   (iv) a column address decoder circuit,
   (v) spare rows and columns for redundancy,
(b) a bank select input for each respective bank, each bank input controlling operation of its respective bank, and
(c) a data path receiver/driver shared by at least two banks.

The macro preferably further includes a master select input capable of latching all the bank select inputs and row address inputs. The macro further includes a shared data path for all banks.

In another aspect, the invention encompasses a methods for operating the eDRAM macro of the invention.

These and other aspects of the invention are described in further detail below.

DETAILED DESCRIPTION OF THE INVENTION

The invention provides a synchronous multibank interface on a growable embedded DRAM. The flexible multibank interface of the invention can be grown without redesign and without change of appearance/behavior to the customer. The interface is preferably characterized by the presence of bank select inputs (pins) which permit selection of one or more banks of the macro. The banks preferably each have respective support circuitry including row decode circuitry and respective limited repair redundancy. The interface of the invention has advantages over typical synchronous DRAM interfaces in that operations to each bank are independent. Also, activation and pre-charge operations can both be completely hidden during reads and writes. The interface of the invention may be used to support multiple bank configurations with any number of banks (i.e., one or more banks).

The multi-bank interface of the invention extends the macro performance by allowing concurrent operations to independent banks and thereby allowing improved bus utilization during multi-bank operations. For example, bank activate and precharge commands may be hidden during read and write cycles. Also, the invention allows for multiple activates and precharges to one to N banks where N is the number of banks in the macro.

The invention is illustrated by specific embodiments below. It should be understood that the embodiment is intended to illustrate an example of the invention. The invention encompasses other embodiments which are not described in detail below.

Figure 1:
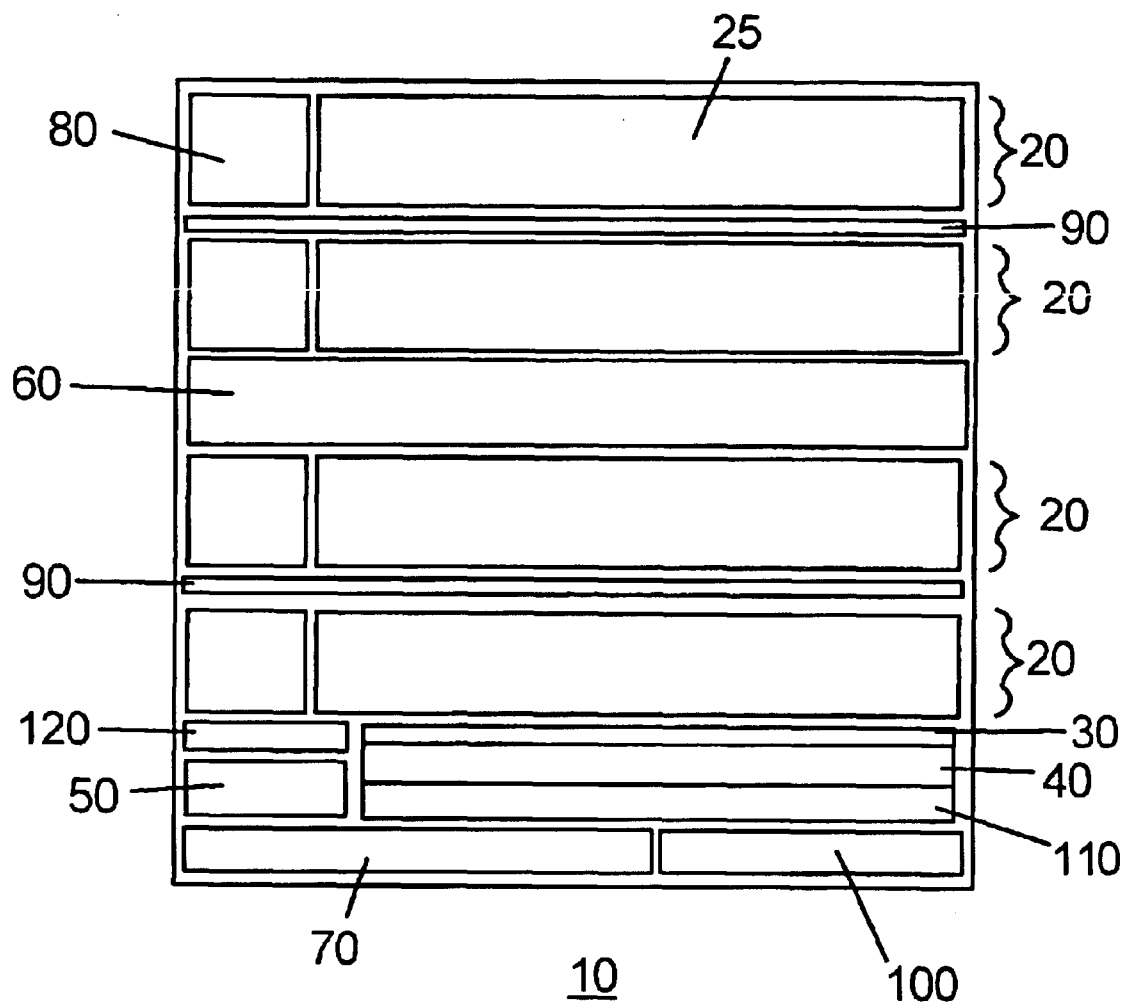
FIG. 1 is a floor plan for a DRAM macro according to an embodiment of the invention.

The embodiment described below is a growable eDRAM macro featuring a flexible multi-banking protocol and a column redundancy scheme to support multi-banking. FIG. 1 shows a high level floor plan of an eDRAM macro embodiment according to the invention. Each eDRAM macro 10 preferably contains a bank(s) 20 having an array of DRAM memory elements 25 (preferably, each bank contains a 1 Mb array), column redundancy 30, data I/O 40, a control system 50, a common power system 60, buffer 120, data comparator/redundancy allocation 110, a built-in self-test engine (BIST) 70, and supporting ROM/SROM 100. The bank comprising memory array and its support circuitry may be stepped to build the desired macro size. (FIG. 1 shows a four bank array.) Thus, a macro of desired size is constructed by replicating the bank the appropriate number of times. If desired, multiple eDRAM macros can be situated on an ASIC chip enabling customers to make the performance/die area trade-off specific to their application.

For a 1 Mb bank array, the cells are preferably organized 512 rows by 2048 columns. The columns are preferably divided in groups of 8×256, producing a 256 bit data word with an 8 bit page depth. An x292 parity option may be supported by adding 288 columns (36 data bits). This organization provides a high array utilization while maintaining performance typically lost by making longer word-lines or bit-lines. Faster core performance can be achieved with shorter word-lines and bit-lines, but at the cost of more wordline decoder/drivers and/or sense amplifiers. The wide I/O provides maximum bandwidth and, for application not requiring the full width, bit-write control may be included to facilitate masking.

Each bank 20 preferably includes a dedicated redundancy repair region. For a 1 Mb bank array, the redundancy repair region preferably contains 8 redundant rows and 8 redundant data bits that can be used to repair faults in that 1 Mb array. The redundancy repair region is preferably limited whereby it can be incorporated in each bank to enable independent bank operation and facilitate growing the macro.

Each bank 20 is preferably supported by a dedicated row decoder 80 and a shared column decoder and local buffer (data path receiver/driver) 90. Each bank 20 preferably acts as an independent bank sharing a common address and data bus. Each bank 20 preferably shares a local buffer (data path receiver/driver) with the other banks of the macro. Shared column decoder(s) and local buffer are preferably placed adjacent to the sense amplifiers of its respective bank(s). The column decoder preferably acts to reduce the I/O to 8:1. This reduction provides 1 bit of data on approximately the same physical pitch as a 12 track logic cell (4.8 $\mu$m). This feature reduces wiring congestion and facilitates bit slice design internal and external to the DRAM macro. Reducing the width from 2 K to 256 provides for enough wiring room to allow independent read and write data buses with ample tracks for power and data shielding.

To support column redundancy with a wide I/O interface (×256), it is preferable to implement redundancy at the data-bit level, as described in U.S. patent application Ser. No. 09/971840, filed Oct. 5, 2001, the disclosure of which is incorporated herein by reference. The row redundancy circuits compare the current address with stored addresses of defective wordlines. If the incoming addresses match a stored defective address, the defective wordline is held inactive and a spare wordline is activated in its place. Redundancy provides repairability and improved yield.

For multi-banking, the column redundancy preferably switches at the page rate, and therefore sets up in a fraction of the time of conventional column redundancy. For speed, the repair solutions are preferably stored in local latches (one per data-bit per bank) and are rapidly selected by the incoming bank address in time to set shifting switches prior to driving write data to sub-array. A bank's column solution is preferably stored in the local latches as string of '0's and '1's with the transition from '0' to '1' indicating a failing location. To reduce fuse count, preferably only the failing address is stored. The string is preferably generated by a counter and latch that toggles when counter matches the address of failing locations and loaded via shift chain at power up. The column solution is preferably implemented through column steering switches in column redundancy section 30 and buffer 120.

Figure 2:
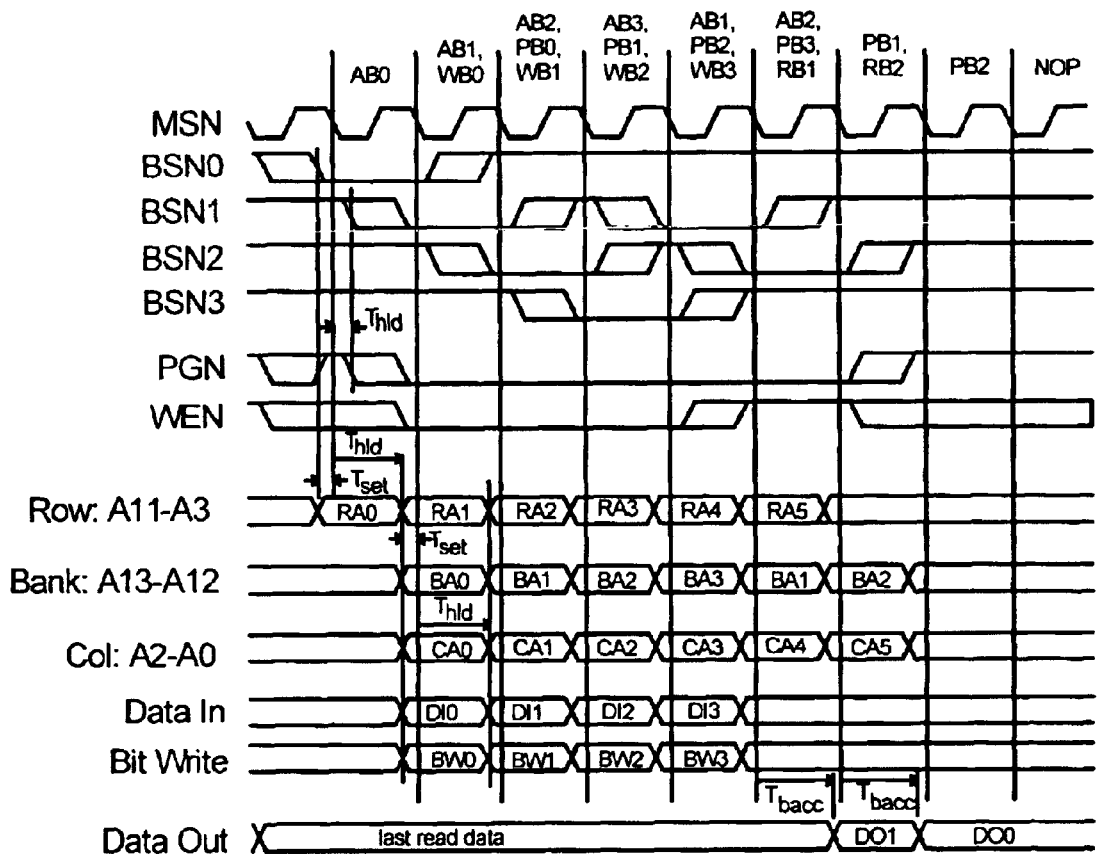
FIG. 2 is a timing diagram showing the operation of a DRAM macro according to the invention.

Each bank select pin (BSN) is associated with a corresponding each bank and is used in conjunction with other command input signals: master select (MSN), Page (PGN), Address (Ax) and Write Enable (WEN) to determine which bank(s) within the macro will respond to input commands. MSN is preferably treated like a master input clock, latching the state of all other input pins with each falling MSN edge as shown in FIG. 2.

On the interface to the memory, a bank select input for each bank is brought out as a control pin for that bank. All BSN inputs are defined at every MSN falling edge to indicate whether each bank is to remain open or closed or whether a bank is to become active/open (from the pre-charge state) or become pre-charged/closed (from the active state). The address bus is preferably not multiplexed (i.e., all addresses are available at the same time) to simplify the design. Alternatively, multiplexing can be used if desired (e.g., to support legacy designs, etc.) such that the eDRAM macro may operate similarly to a synchronous DRAM (SDRAM) where addressing is performed in a RAS/CAS type manner, and the master select input (MSN) is treated like a master input clock, latching the state of all other input pins with each falling MSN edge.

Any combination of banks within a macro can be active simultaneously. Preferably, each bank is opened in a sequential fashion. The row address for each active bank will remain latched until the bank is pre-charged. This frees the row address bus to allow other banks to be activated at a different row address on subsequent MSN clock cycles. No address information is required to pre-charge a bank.

By latching a BSN in low when it was previously high, an activate is issued. By latching in a BSN high when it was previously low, a precharge is issued. When latching in a BSN low when is was previously low, a write or read to that bank can be issued. When an activate is issued, the row address latched and used to activate that row address to all banks being activated. This interface does not limit the number of BSN pins that may be going low on any one cycle. However, all banks being activated in one cycle will open the same row address so this function may have limited use (refresh is one possibility). The bank address is latched to select which bank has control of the shared data bus.

Another pin (PGN), paging to memory, is used to enable the write/read operation to an active bank. If PGN is latched in high, no write or read will occur. If PGN is latched in low, the bank specified by the current bank address (BA) will be written or read based on the state of WEN. When a read or write is issued to a bank, the column address is latched and selects which column to write or read from. Table 1 below shows a truth table of the commands.

TABLE 1

Command Truth Table

| | Activate | Read | Write | Refresh | Precharge |
|---|---|---|---|---|---|
| BSN | -> 0 | 0 | 0 | 0 | -> 1 |
| PGN | X | 0 | 0 | 1 | X |
| WEN | X | 1 | 0 | X | X |
| Row Address (RA) | V | X | X | V | X |

TABLE 1-continued

Command Truth Table

| | Activate | Read | Write | Refresh | Precharge |
|---|---|---|---|---|---|
| Bank Address (BA) | X | V | V | X | X |
| Column Address (CA) | X | V | V | X | X |

In Table 1, the five basic commands to the eDRAM are shown. A '0' indicates low, '1' indicates high, '→0' means going low on that cycle, '→1' means going high on that cycle, 'X' indicates a don't care and 'V' indicates a valid address. Note that multiple commands are allowed on a single cycle. For example, an activate to bank 0 and a read to bank 1 can both occur on the same cycle because the state of each pin is either the same or one is a don't care. This allows the customer to completely hide the activate and precharge portions of a memory access during read and writes to other banks therefore optimizing bus utilization. As the eDRAM is grown, the bank count can increase without complicating or changing the interface (other than the number of BSN pins). To handle this, the BSN pins are labeled from BSN<0> to BSN<N> where N+1 is the number of banks. The timing diagram in FIG. 2 shows a sample of bank operations to a 4 bank eDRAM. Having individual BSN pins for each bank further enables unambiguous support for a non-binary number of banks (like 3, 5, 6, 7, 9, etc).

In this timing diagram, MSN is shown as an active low clock where signals are latched on the falling edge. BSN0 is the bank select to bank 0, BSN1 is the bank select to bank1, etc. These are active low. PGN is the active low page strobe that activate the data path. WEN is low for a write cycle and high for a read cycle. Note that the row address (A11–A3) is lined up the bank activates where the bank and column addresses (A13–A12 and A2–A0, respectively) are lined up with the write and read operations. DI is the data in bus, DO is the data out bus and BW is a bit mask bus that is used on the eDRAM. On each cycle, a description of the operation is given above MSN. BAx is a bank activate to bank x. PBx is a precharge to bank x. RBx is a read to x, WBx is a write to x. NOP indicates no activate, pre-charge, read or write on that cycle. Note that the precharge of bank1 at 20 ns does not interrupt the data bus, and that the activate of bank1 at 25 ns to a new row address also does not interrupt the data bus.

The protocol supports simultaneous activate, read/write and pre-charge to three different banks. Maximizing the number of banks in a macro improves the probability of missing an open bank and maintaining peak bandwidth (preferably at least 8 GByte/sec).

What is claimed is:

1. A multibank DRAM macro allowing concurrent operations to independent banks, said macro comprising:
    (a) a plurality of DRAM memory banks, each bank respectively comprising:
        (i) an array of DRAM memory cells,
        (ii) bitlines and wordlines, respectively defining columns and rows of the array,
        (iii) a dedicated row address decoder circuit,
        (iv) dedicated spare rows and columns for redundancy,
    (b) at least one column address decoder circuit shared by at least two of said banks,
    (c) a dedicated bank select input pin for each respective bank, each bank select input pin being brought out as a control pin at an interface to said macro, each bank select input pin controlling operation of its respective bank and allowing concurrent operations to independent banks, and
    (d) a data path receiver/driver shared by at least two banks.

2. The DRAM macro of claim 1 further comprising (d) a master select input.

3. The DRAM macro of claim 2 wherein said bank select inputs pins are latched to a falling edge of a signal from said master select input.

4. The DRAM macro of claim 1 wherein said macro further comprises a write enable input.

5. The DRAM macro of claim 1 wherein said macro further comprises a page mode select input.

6. The DRAM macro of claim 1 wherein each bank further comprises (v) at least one sense amplifier.

7. The DRAM macro of claim 1 wherein each bank has capacity for about 1 Mb of data.

8. The DRAM macro of claim 7 wherein said macro comprises at least 4 of said banks.

9. An integrated circuit device comprising a logic core and a DRAM macro wherein said DRAM macro is a multibank DRAM macro allowing concurrent operations to independent banks, said DRAM macro comprising:
    (a) a plurality of DRAM memory banks, each bank respectively comprising:
        (i) an array of DRAM memory cells,
        (ii) bitlines and wordlines, respectively defining columns and rows of the array,
        (iii) a dedicated row address decoder circuit,
        (iv) dedicated spare rows and columns for redundancy,
    (b) at least one column address decoder circuit shared by at least two of said banks,
    (c) a dedicated bank select input pin for each respective bank, each bank select input pin being brought out as a control pin at an interface to said macro, each bank select input pin controlling operation of its respective bank and allowing concurrent operations to independent banks, and
    (d) a data path receiver/driver shared by at least two banks.

10. The integrated circuit device of claim 9 wherein said DRAM macro further comprises (c) a master select input.

11. The integrated circuit device of claim 10 wherein said bank select input pins are latched to a falling edge of a signal from said master select input.

12. The integrated circuit device of claim 9 wherein said DRAM macro further comprises a write enable input.

13. The integrated circuit device of claim 9 wherein said DRAM macro further comprises a page mode select input.

14. The integrated circuit device of claim 9 wherein each bank of said DRAM macro further comprises (v) at least one sense amplifier.

15. The integrated circuit device of claim 9 wherein each bank of said DRAM macro has capacity for about 1 Mb of data.

16. The integrated circuit device of claim 15 wherein said DRAM macro comprises at least 4 of said banks.

* * * * *